United States Patent [19]

Aiello et al.

[11] Patent Number: 5,382,837
[45] Date of Patent: Jan. 17, 1995

[54] SWITCHING CIRCUIT FOR SEMICONDUCTOR DEVICE

[75] Inventors: Natale Aiello, Catania; Sergio Palara, Acicastello, both of Italy

[73] Assignee: Consorzio per la Ricerca Sulla Microelecttronica nel Mezzogiorno, Catania, Italy

[21] Appl. No.: 902,385

[22] Filed: Jun. 23, 1992

[30] Foreign Application Priority Data

Jun. 27, 1991 [EP] European Pat. Off. ........ 91830287.8

[51] Int. Cl.⁶ ............................................. H03K 17/735
[52] U.S. Cl. ................................. 327/417; 327/482; 327/80; 327/77
[58] Field of Search ............... 307/350, 354, 362, 363, 307/358, 364, 253, 315, 242, 272.3, 244, 254; 328/105, 153

[56] References Cited

U.S. PATENT DOCUMENTS

| | | | |
|---|---|---|---|
| 3,979,606 | 9/1976 | Ahmed | 307/235 |
| 4,086,503 | 4/1978 | Fox et al. | 307/363 |
| 4,401,897 | 8/1983 | Martino, Jr. et al. | 307/296.2 |
| 4,473,758 | 9/1984 | Huntington | 307/296.2 |
| 4,617,473 | 10/1986 | Bingham | 307/66 |
| 4,771,189 | 9/1988 | Noufer | 307/36 |
| 4,900,950 | 2/1990 | Dubujet | 307/272.3 |
| 5,120,993 | 6/1992 | Tsay et al. | 307/296.4 |
| 5,187,389 | 2/1993 | Hall et al. | 307/350 |
| 5,208,488 | 5/1993 | Takiba et al. | 307/362 |

FOREIGN PATENT DOCUMENTS

| | | | |
|---|---|---|---|
| 2929515 | 10/1980 | Germany . | |
| 0702519 | 12/1979 | U.S.S.R. | 307/363 |
| 0764097 | 9/1980 | U.S.S.R. | 307/296.2 |
| 8605932 | 10/1986 | WIPO | 307/363 |

*Primary Examiner*—Timothy P. Callahan
*Assistant Examiner*—Terry D. Cunningham
*Attorney, Agent, or Firm*—Felsman, Bradley, Gunter & Dillon

[57] ABSTRACT

A circuit for connecting a first circuit node to either a second or a third circuit node relative to the voltage potential on the third circuit node includes two bipolar transistors connected in series. The collectors of both transistors are connected to the first circuit node. The emitter of the first transistor is connected to the second circuit node and the emitter of the second transistor is connected to the third circuit node. Means are provided for maintaining the base of the second transistor at a constant, preset bias voltage.

13 Claims, 7 Drawing Sheets

SWITCHING CIRCUIT FOR SEMICONDUCTOR DEVICE

BACKGROUND OF THE INVENTION

1. Technical Field

The present invention relates to a switching circuit for connecting a first circuit node to either a second or a third circuit node in relation to the potential on the latter node, and more particularly for controlling the potential of the insulation region of an integrated circuit in relation to the potential of the substrate.

2. Description of the Related Art

Consider a circuit in which there is a control device for driving a power device such as an NPN transistor or Darlington, which has a resonant load connected to its collector. When the control device switches the power device, the potential on the collector of the power device can assume negative values. This does not represent a problem in the case of hybrid circuit, with a power device physically insulated from the integrated circuit which forms the control device. However, such negative voltages can be extremely harmful in the case wherein the control device and the power device are integrated on a single silicon chip in a vertical-type structure.

Under normal operating conditions, the insulating region (or P-well) of that part of the integrated circuit used to fabricate the control device is connected to the lowest potential available. In practice, this is ground potential. During operation of the power device, its collector is at a positive voltage. In an integrated circuit device, the collector is the substrate of the integrated circuit. During operation, parasitic transistors which are formed in the integrated circuit are switched off.

If for any reason, for example when the control device executes switching operations, the substrate goes below ground by an amount more than the conduction threshold, the parasitic transistors go into conduction and drain current away from the control device. This causes a malfunction of both the control device and the power device.

To eliminate this drawback, it is in theory sufficient to connect the insulation region of the power device to a negative voltage equal to the maximum below ground value reachable by the substrate. However, negative power sources are not always available to the integrated circuit, and the lowest available potential is normally that of ground, constituted by the casing.

A circuit which allows this drawback to be overcome is described in patent application Ser. No. 89/16144, filed in France on 29 Nov. 1989 in the name of SGS-THOMSON MICROELECTRONICS and SIEMENS AUTOMOTIVE. In such application, a dynamic insulation circuit for integrated circuits is described. Such circuit is usable in an integrated circuit of the type described above, comprising a control device driving a power device connected to a resonant load. This circuit provides that use is made of MOS devices to fabricate a first stage suitable for generating a first voltage level relative to the value of the voltage assumed by the integrated circuits' substrate. It further includes a second stage which has a first and a second transistor acting as a switch. This switch is suitable for connecting the insulation region to either the ground or the substrate, depending upon the values of voltage assumed by the substrate itself.

The described circuit, however, is very complicated due to the large number of circuit components required, and due to the manner in which the conductive state of the second transistor is obtained. Additionally, the switching threshold of the second transistor with the switching function is obtained relative to the substrate's voltage.

SUMMARY OF THE INVENTION

One object of the present invention is to overcome the above mentioned drawbacks through provision of a switching circuit which is especially simple as regards both the structure of the circuit and the number of components required. Preferably, the switching circuit is suitable for connecting the insulating region of the control device alternately to the substrate and to ground, respectively, in response to a negative and positive substrate voltage.

One general object of the present invention is to provide a switching circuit for connecting a first circuit node to either a second or a third circuit node depending upon the potential of the third circuit node.

Therefore, according to the present invention, a circuit for connecting a first circuit node to either a second or a third circuit node relative to the voltage potential on the third circuit node includes two bipolar transistors connected in series. The collectors of both transistors are connected to the first circuit node. The emitter of the first transistor is connected to the second circuit node and the emitter of the second transistor is connected to the third circuit node. Means are provided for maintaining the base of the second transistor at a constant, preset bias voltage.

BRIEF DESCRIPTION OF THE DRAWINGS

The features of the present invention shall be made more evident by the embodiments illustrated as a non-limiting example in the enclosed drawings, wherein.

DETAILED DESCRIPTION OF PREFERRED EMBODIMENT

The objects of the present invention are attained by means of a switching circuit for connecting a first circuit node to either a second or a third circuit node relative to the potential on the third circuit node. In a particular application, the circuit can be used for controlling the potential of an insulation region of an integrated circuit in relation to the substrate's potential. Such a circuit includes a first NPN transistor with the collector connected to the first node and the emitter connected to the second node. The collector of a second NPN transistor is also connected to the first node, and its emitter is connected to the third node. Means are provided for maintaining the base of the second transistor at a constant preset bias voltage.

In a particular application, the third circuit nodes form part of an integrated circuit including a power device. The collector of the power device coincides with the substrate of the integrated circuit and constitutes the third node. The control circuit for the power device is formed in an insulation region which constitutes the first node. The second node is constituted by connection to ground. The insulation region of the integrated circuit is ultimately connected to the substrate or ground through the first and second transistors of the switching circuit according to the voltage assumed by the substrate of the integrated circuit and thus by the collector of the power device. This type of device is appropriate for use with the fabrication of a power device for driving a resonant load, and of the corresponding control device in a single integrated circuit structure of the vertical type.

The description which follows relates to an integrated circuit containing a power device, such as a power transistor or Darlington, for driving a resonant load connected to its collector. The integrated circuit also includes a control device for the power device, and a switching circuit according to the present invention. This does not mean that the invention is limited to such use, but may be applicable to any type of use which involves the alternate connection of a first circuit node to a second or a third circuit node as a function of the voltage potential at the third circuit node.

Figure 1:
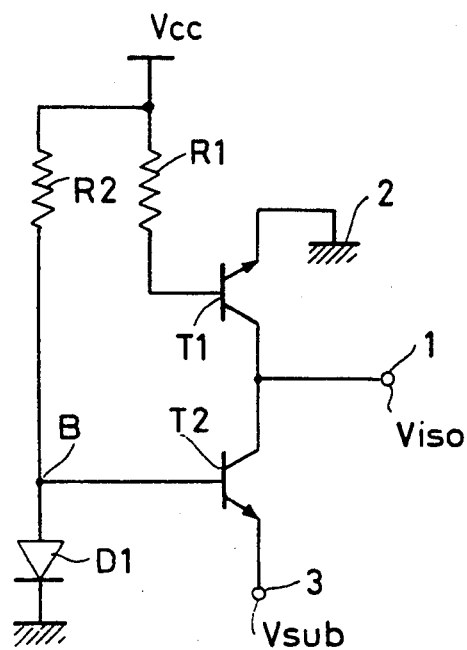
FIG. 1 illustrates a first circuit embodiment of the switching circuit according to the present invention.

According to a first embodiment, as illustrated in FIG. 1, a switching circuit according to the present invention includes an NPN transistor T1 having the function of a switch. The collector of transistor T1 is connected to a first circuit node 1, at a voltage of Viso for example, which forms an insulation region of the integrated circuit which contains the control circuit for the power device. The emitter is connected to a second circuit node 2 at ground voltage. The base is connected through a resistor R1 to a power supply Vcc.

The circuit also includes a second NPN transistor T2 which also functions as a switch. The collector of transistor T2 is connected to the voltage Viso, and the emitter is connected to a third circuit node 3 at the voltage Vsub. Node 3 is the substrate of the integrated circuit, which is coincident with the collector of the power device. The base of transistor T2 is connected to the power supply Vcc through resistor R2, and to ground through a base bias diode D1. Diode D1 maintains the base of transistor T2 at a constant voltage, for example, equal to Vbesat (the base-emitter voltage of the transistor T2).

If the Vsub on the third circuit node 3, and thus on the substrate of the integrated circuit, is higher than zero, the transistor T1 is in saturation. In this mode it connects, at less than the Vcesat (T1) (the collector-emitter saturation voltage of transistor T1) to the first circuit node. Thus, the insulation region of the integrated circuit is connected to the second circuit node 2, and thus to the circuit's ground.

In this condition, transistor T2 is off since the base potential of the transistor T2 has been fixed at Vbe by means of the diode D1. In order to be able to enter into conduction, the second transistor T2 must have a voltage greater than Vbe between its base and emitter.

When the substrate voltage is less than or equal to zero, the transistor T2 goes into saturation, since its base is always at Vbe. This has the object of bringing the circuit node 1, the insulation region of the integrated circuit, to the same potential Vsub as circuit node 3. Thus, circuit node 1 is at the same potential as the substrate, less the voltage Vcesat (T2). As a consequence, the collector of transistor T1 is at a potential that is lower than of its emitter, so that transistor T1 is reverse biased.

As is known in the art, the current gain of a reverse biased transistor, on the order of units, is far less than that of a directly biased transistor, on the order of hundreds of units. Therefore, the current required in circuit node 1, the insulation region of the integrated circuit, through transistor T1 is negligible with respect to the current which flows through transistor T2 from circuit node 1 to circuit node 3. Since the current flowing from the insulation region towards the substrate is relatively much higher, transistor T1 behaves to a good approximation like an open circuit.

Figure 2:
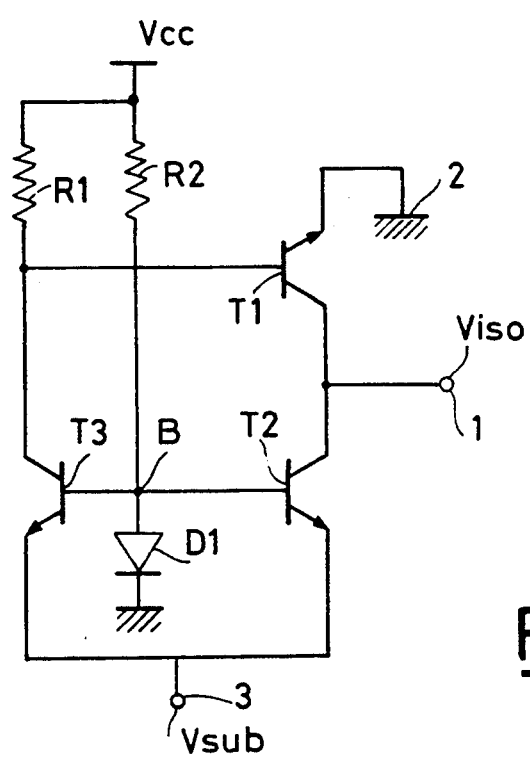
FIG. 2 illustrates a second circuit embodiment of the circuit according to the present invention.

The circuit of FIG. 2 represents a second embodiment of a switching circuit according to the present invention. This circuit differs from that of the first embodiment, represented in FIG. 1, by the addition of a third transistor T3. The base and emitter of transistor T3 are connected to the base and emitter of transistor T2, respectively. The collector of transistor T3 is connected to the base of transistor T1, and to the supply voltage Vcc through resistor R1.

Analyzing its operation, still with reference to an integrated circuit as described above, when the substrate voltage Vsub is greater than zero, the second and third transistor T2 and T3 are off. This is because their bases, as for the case of transistor T2 and the circuit of FIG. 1, are linked to the potential Vbe by the presence of diode D1 connected thereto.

Since transistor T3 is switched off, transistor T1 operates in saturation because its voltage is equal to the difference between the supply voltage Vcc and the voltage across the resistor R1. This has the effect of consequently linking the potential of the insulation region to the ground of the circuit.

When the substrate voltage is less than or equal to zero, the transistors T1 and T2 go to saturation since their bases are always at Vbe. The saturation of transistor T2 causes the linking of the insulation region to the same potential as that of the substrate. The saturation of transistor T3 lowers the potential of the base voltage of transistor T1 to values that are less than or equal to zero. This causes transistor T1 to be turned off.

Of the two circuits, that of FIG. 1 is faster in action than that of FIG. 2. This is so because transistor T1 is always in conduction in FIG. 1. The circuit of FIG. 2 has the advantage of more decisively turning off transistor T1.

Figure 3:
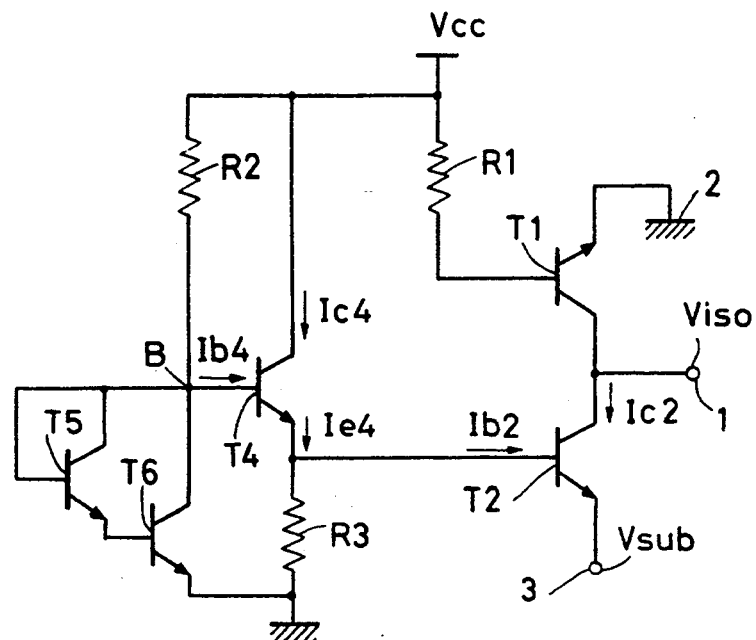
FIG. 3 illustrates a first improvement of the first circuit embodiment illustrated in FIG. 1.
Figure 4:
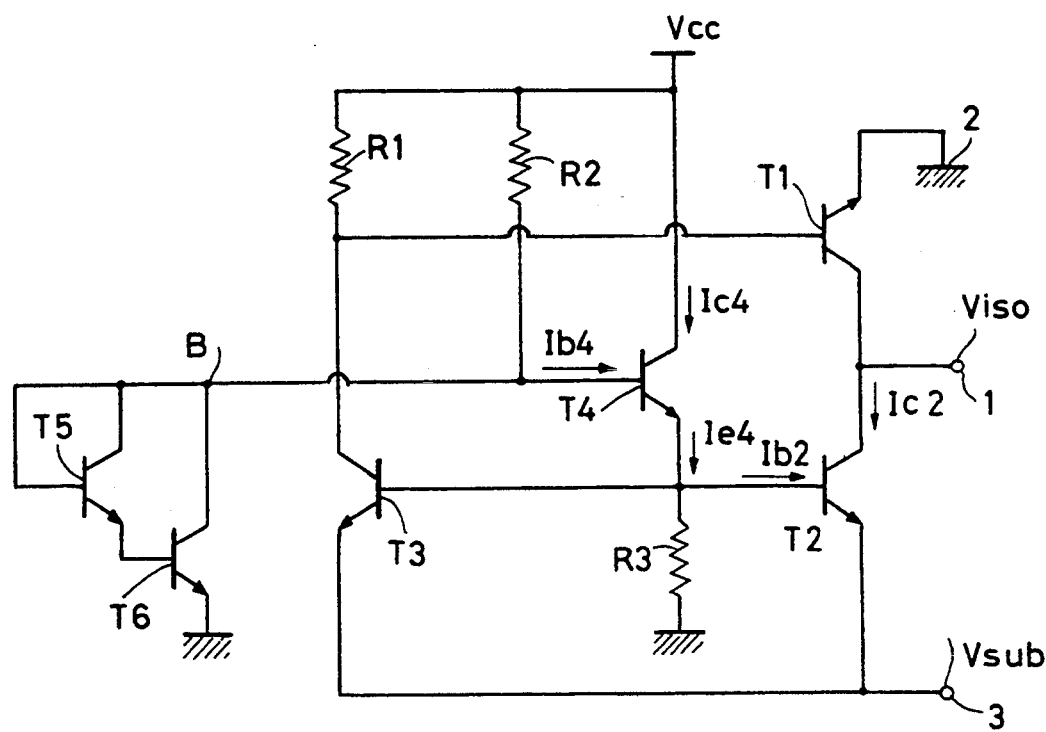
FIG. 4 illustrates a first improvement of the second circuit embodiment illustrated in FIG. 2.

For reasons of a technological character, the circuits of FIGS. 1 and 2 have been modified to those shown in FIGS. 3 and 4, respectively.

The circuit of FIG. 3 is a modified version of the circuit of FIG. 1. The modified circuit differs from the circuit of FIG. 1 only in the introduction of transistors T4, T5, T6, and of a resistance R3. Transistor T4 has its collector connected to the power supply Vcc. Its emitter is connected to the base of transistor T2 and to ground through the resistor R3. The base of transistor T4 is connected through resistor R2 to the power supply Vcc. The collectors of transistors T5 and T6 are connected to the base of transistor T4 as circuit node B. The collector of transistor T5 is connected to its base, and its emitter is connected to the base of transistor T6. The emitter of transistor T6 is grounded.

In a similar manner, the circuit of FIG. 4 is the modified version of the circuit of FIG. 2. FIG. 4 differs from FIG. 2 only in the introduction of the same transistors T4, T5, and T6, and of the resistor R3. These elements are inserted into the circuit and connected in a manner just like that described in connection with FIG. 3.

As will be explained in more detail with reference to FIGS. 8, 9, and 10, which represent embodiments in the integrated form of the circuits of FIGS. 1 and 2, the transistor T2 is formed outside the insulating region of the integrated circuit. Transistor T2 has a very low current gain (equal to 2) so that it is necessary to drive it with a transistor T4.

The circuit operates in accordance with the following equations:

$$Ic2 = hfe2 * Ib2$$

where $Ib2 \approx Ie4$ is approximately equal to $hfe4*Ib4$, and substituting results in:

$$Ic2 = hfe2 * hfe4 * Ib4$$

where Ic2 is the collector current of the transistor T2, Ib2 is the base current of transistor T2 and Ie4 is the emitter current of transistor T4. In addition, hfe2 and hfe4 are the current gains of transistors T2 and T4.

Transistors T5 and T6 have been inserted in place of the diode D1 so as to continue to maintain the circuit's switching threshold at about zero volts. Since the transistor T2 operates with a Vbe of about 0.5 volts, the potential of the node B is 1.2 volts. As a consequence, it has not been possible to use two diodes connected in series, which would have resulted in a potential of 1.4 volts at the node B.

It could also be possible to use a voltage multiplier formed by a transistor with the collected connected to the node B, the emitter connected to ground and the base connected to an intermediate node between resistances placed in series and connected between node B and ground. This multiplier, however, suffers from the drawback of taking up a larger area than is taken up by the two transistors T5 and T6. Utilizing the two cascade transistors T5, T6 in the circuits of FIGS. 3 and 4 has resulted in an obtainable value for the voltage at point B of approximately 1.28 volts. This voltage is the sum of the Vbe of transistor T5, equal to 0.7 volts, and the Vbe of transistor T6, equal to approximately 0.58 volts. The Vbe of transistor T6 is different from 0.7 volts because, since transistor T6 has not been diode connected, its Vbe is proportional to the collector current.

A further manner for accomplishing the circuit of FIG. 3 is that of introducing, in place of the resistor R3, a diode D2 in series with a small resistor R4. The diode has a corresponding series resistance, and these two elements in series are connected between the emitter of transistor T4 and ground. Resistor R4 preferably has a value equal to approximately 10 Ohms with the object of limiting the current Ic4. The corresponding circuit solutions, starting with modifications of the circuits illustrated in FIGS. 3 and 4, are illustrated in FIGS. 5 and 6 respectively.

Figure 5:
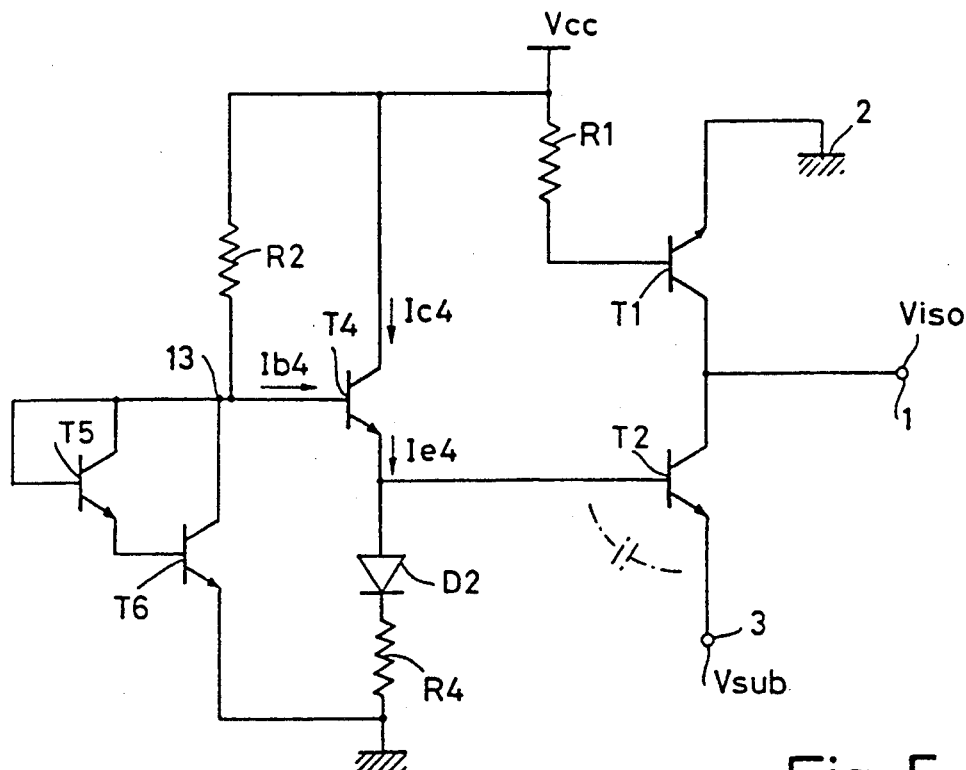
FIG. 5 illustrates a second improvement of the first circuit embodiment illustrated in FIG. 1.

The introduction of this modification improves the performance of the circuit since it allows the discharge of the emitter-base capacitance of the transistor T2 as shown in FIG. 5. In FIG. 6, the corresponding transistors T2 and T3 are both discharged. In both Figures, these capacitances are indicated with dotted lines. This discharge is made to ground, and not to the insulation region as was the case in previous embodiments of these circuits. Discharge to the insulation region would involve the rise of voltage Viso beyond the limit empowered by saturation of transistor T1.

The operation of the circuits of FIGS. 5 and 6 can be analyzed as follows. When the substrate voltage Vsub is less than zero, the second transistor T2 goes to saturation, thereby taking its base to a negative potential. As a result, diode D2 is reversed biased. In this case, with respect to the circuit of FIG. 3 in which there is only the resistor R3 connected to the emitter of transistor T4, there is a further advantage during the conductive stage of transistor T2 since there is no conduction of current to ground through R3.

Figure 6:
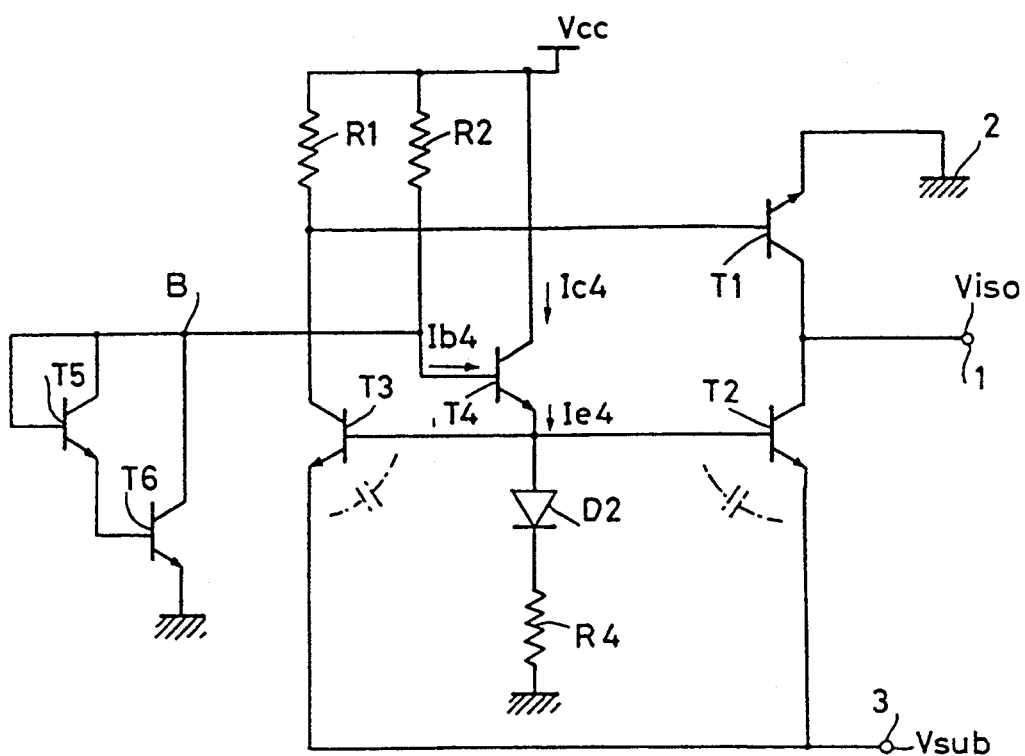
FIG. 6 illustrates a second improvement of the second circuit embodiment illustrated in FIG. 2.

When the substrate goes to a potential that is higher than or equal to zero, the diode D2 starts conducting and allows the discharge of the capacitance between the base and emitter of transistor T2 in the case of FIG. 5, and of the capacitance between the base and emitter of transistors T2 and T3 in the case of FIG. 6. This discharge is made to ground with a fairly small time constant imposed by the value of the series resistances of resistor R4 and the series resistance of diode D2.

Figure 7:
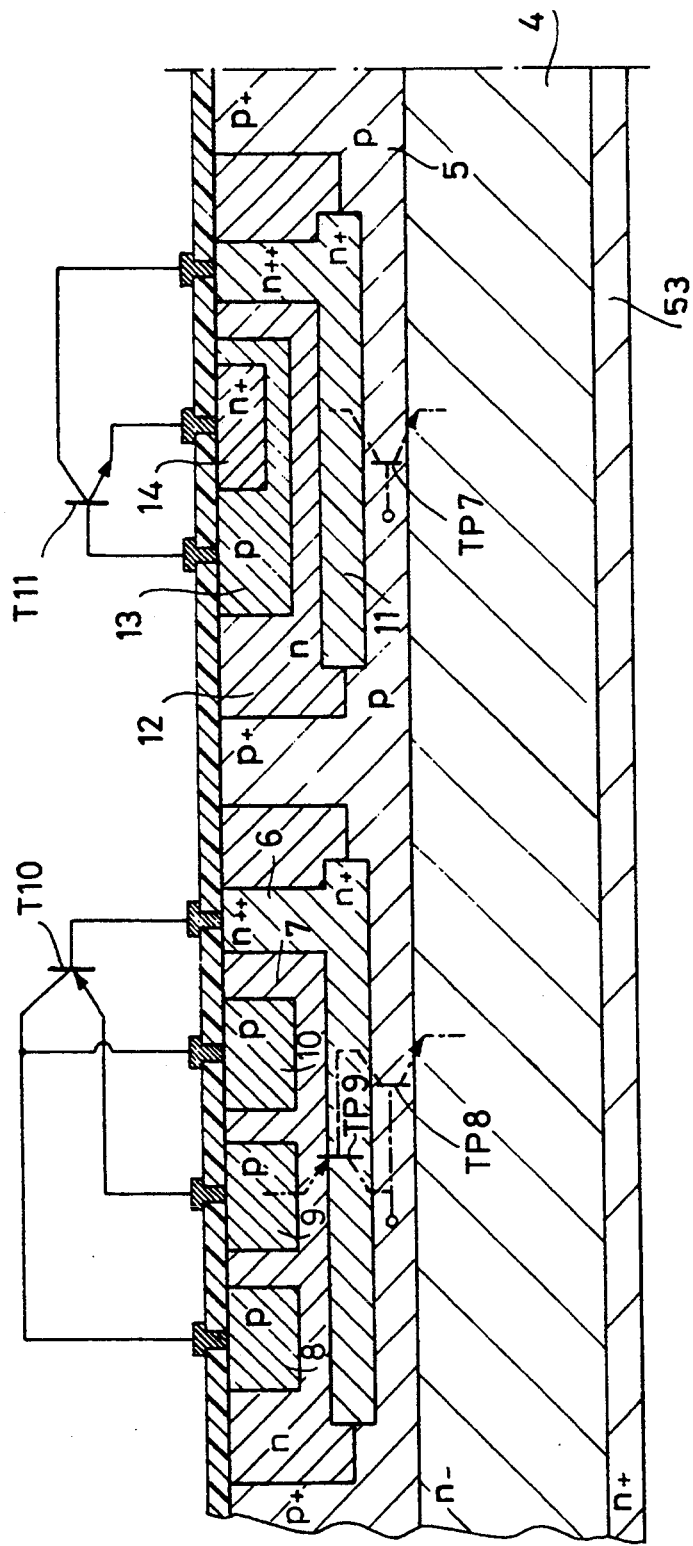
FIGS. 7 and 8 illustrate adjacent parts of an integrated circuit comprising, on a single silicon chip, a power device, a control device, and a switching circuit according to the embodiment of FIG. 1.
Figure 8:
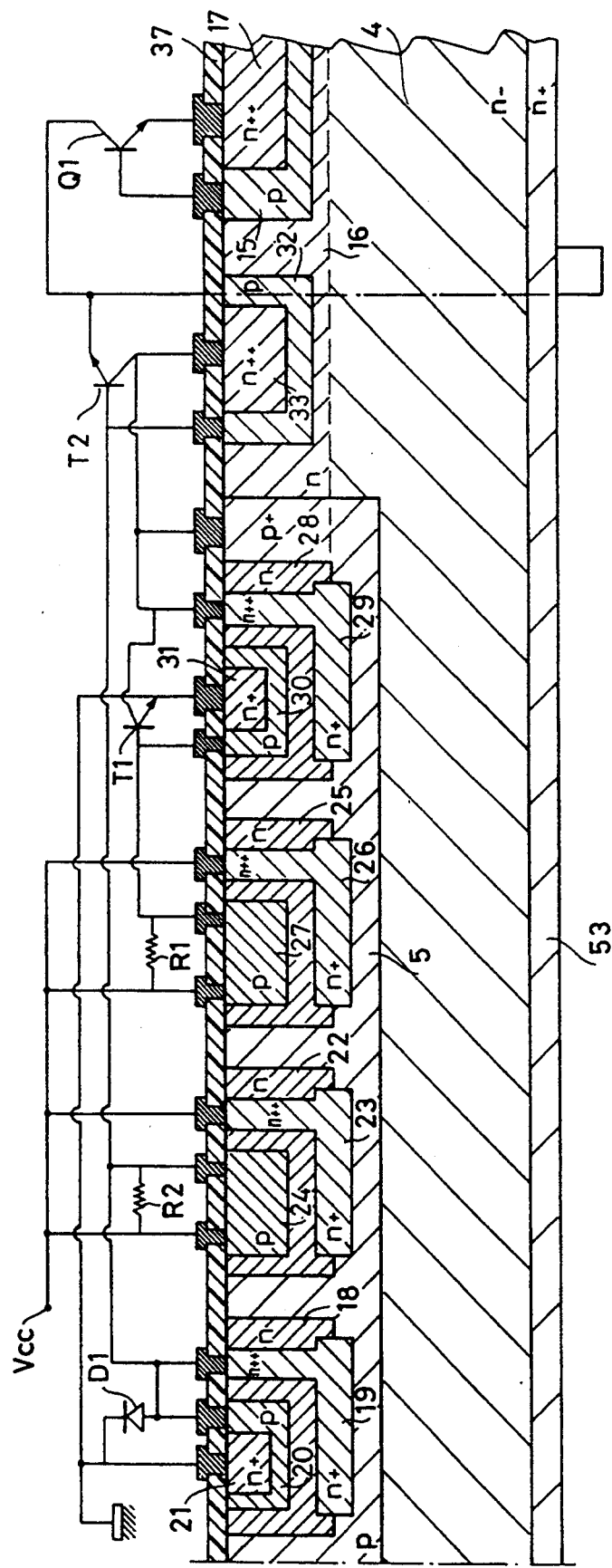
Figure 9:
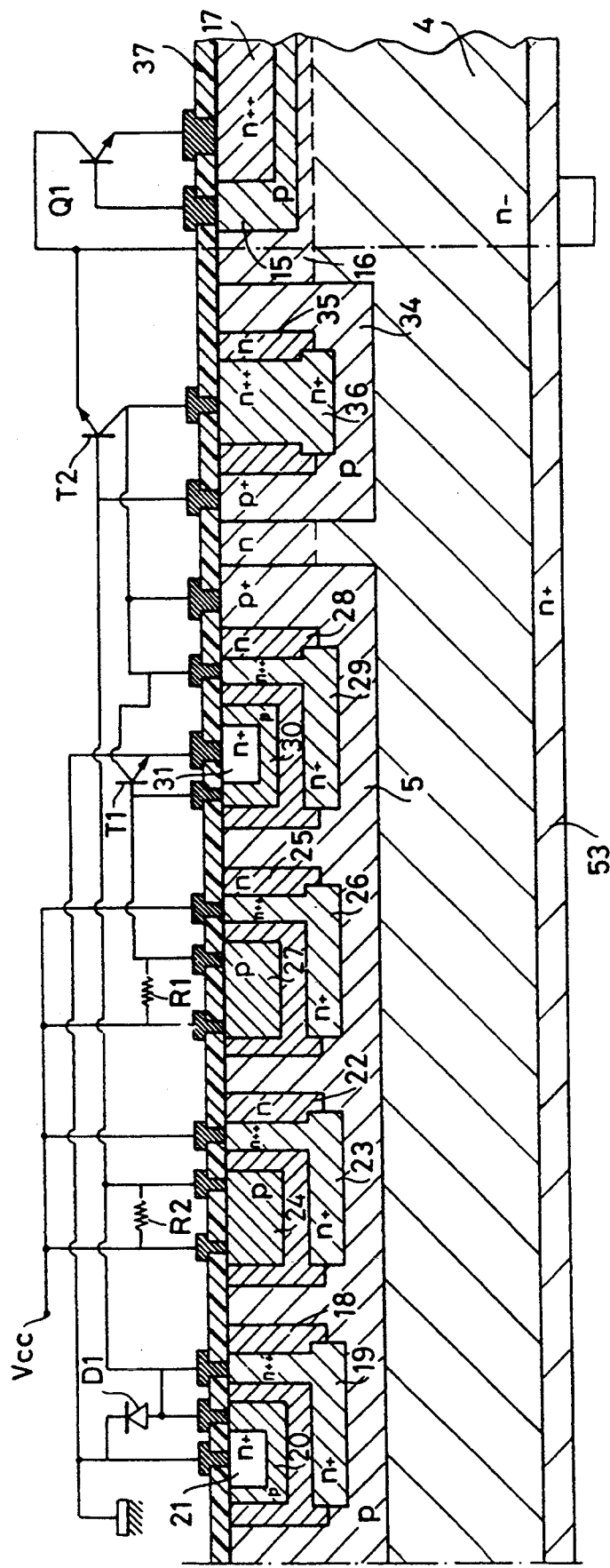
FIG. 9 illustrates an embodiment alternative to that illustrated in FIG. 8.

Integrated circuit embodiments of the above circuits are shown in FIGS. 7, 8, and 9. FIG. 7 should be considered to be aligned to the left of either FIGS. 8 or 9. The dotted line at the right side of FIG. 7 is matched to the corresponding dotted line at the left side of either FIG. 8 or 9.

Referring to FIGS. 7 and 8, a substrate 53, of the type n+, represents the collector of the power device. Over this layer is superimposed an n- epitaxial layer 4. Inside the epitaxial layer 4 is a p type insulation region 5, called the p-well region.

Referring to FIG. 7, inside region 5 there is an n+ region 6 suitable for forming the base of lateral PNP transistor T10. Inside the region 6 there is an n type region 7, with p type regions 8 and 10 inside of this. Regions 8 and 10 are suitable for forming a collector of the lateral transistor. P type region 9 is suitable for forming the emitter of this lateral transistor.

Also referring to FIG. 7, n type region 11 is also formed inside of region 5. This region is suitable for forming the collector of a vertical NPN transistor T11. Inside the region 11 there is an n type region 12, with a p type region 13 inside of this. Region 13 is suitable for forming the base of vertical transistor T11. Inside of region 13 is formed an n+ region 14 which is used as the emitter of the vertical transistor.

The lateral PNP transistor T10 and the vertical NPN transistor T11 together are used to form the control device for the power device.

The region 5 also forms the base of a first parasitic transistor TP7, which has a collector formed by region 11 and an emitter formed by region 4. Parasitic transistor TP8 is formed in an SCR configuration with a third parasitic transistor TP9. Region 4 is the emitter of parasitic transistor TP8, and the collector thereof is formed by region 6 and connected to the base of parasitic transistor TP9. The collector of parasitic transistor TP9 is also formed in region 5, and connected to the base of transistor TP8. Region 9 forms the emitter of parasitic transistor TP9.

Referring to FIG. 8, a circuit is shown which corresponds to the integrated embodiment of the circuit of FIG. 1. Within the region 5 there is formed n type region 18 which contains inside of it a region 19 which is n++ towards the surface of the integrated circuit and n+ in the deep region. Also contained in region 18 is p type region 20. N+ type region 21 is formed inside of region 20. The regions 20, 21 represent the p type and n type regions of diode D1.

Region 22 is also formed inside region 5, and contains therein a region 23 which is also n++ towards the surface of the integrated circuit, and n+ in a deep region. Within region 22 is a p type region 24 suitable for forming the diffused resistor R2. N type region 25 is also formed inside region 5. Within region 25 is formed a region 26 which is n++ towards the surface and n+ in a deep region. P type region 27 is formed inside region 25, and forms the diffused resistor R1.

N type region 28 is also formed inside region 5. Inside region 28 is a region 29 which is n++ towards the surface of the integrated circuit, and n+ in a deep region. Within region 28 is formed p type region 30, and n+ type region 31 is formed inside of region 30. The region 30, 31, and 29 represent the base, emitter, and collector, respectively, of transistor T1.

In an n type subregion 16 within region 4 a p type region 15 is formed. Within region 15 is an n++ region 17. Region 15 forms the base, and region 17 the emitter, of power device Q1. The collector of the power device, as described above, is formed by the substrate 53.

Also within subregion 16 is formed a p type region 32. Within region 32 is formed n++ region 33. The regions 32, 53, and 33 represent the base, emitter and collector, respectively, of transistor On the surface of the integrated circuit, oxide layer 37 is formed. Various access contacts are made through oxide layer 37 to the various regions of the integrated circuit.

Referring now to FIG. 9, the circuit shown differs from that of FIG. 8 only in the manner in which the transistor T2 is formed. In this embodiment, the base region of T2 is formed by a region 34 which is p+ towards the surface and p type in a deep region. Within region 34 an n type region 35 is formed, and inside of this a region 36 which is n++ towards the surface and n+ in a deep region. Region 35 forms the collector of transistor T2. The emitter of transistor T2 is formed by the substrate 53.

Figure 10:
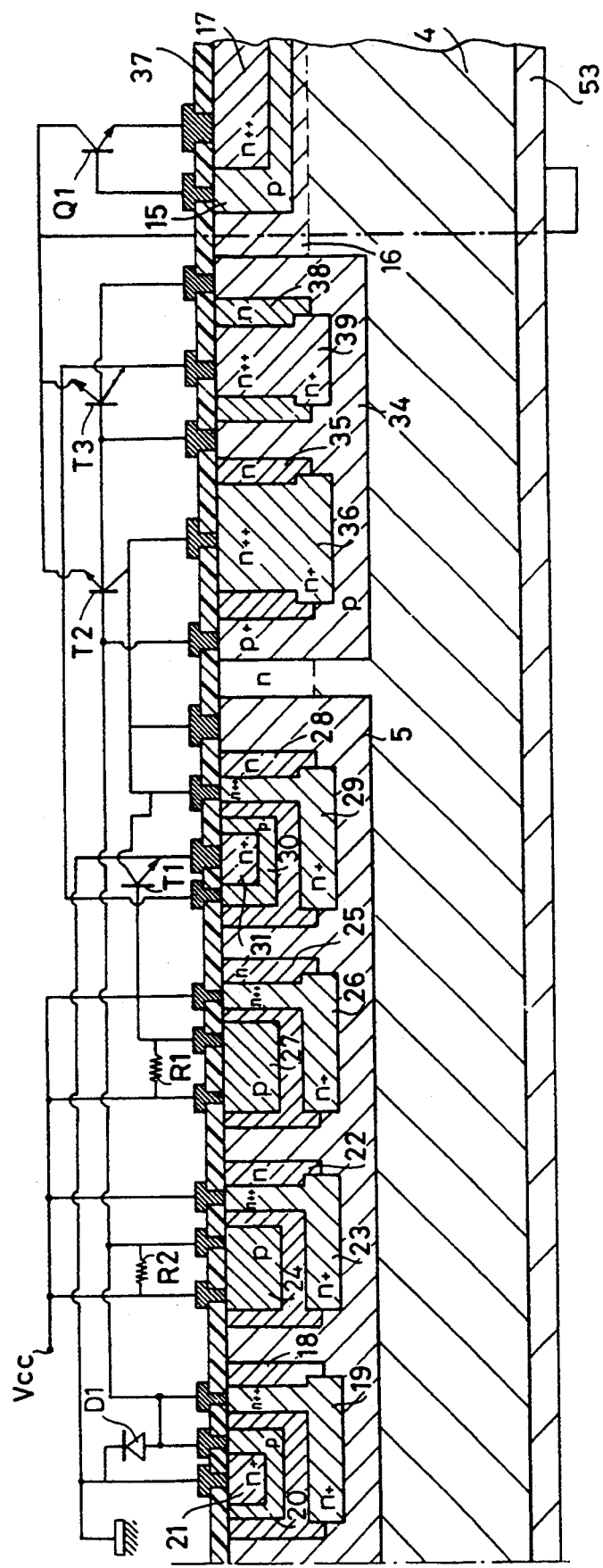
FIG. 10 illustrates the embodiment in an integrated circuit of the switching circuit illustrated in FIG. 2, and of the power device.

Referring to FIG. 10, a circuit is shown which corresponds to the integrated representation of the circuit of FIG. 2. The circuit differs from that shown in FIG. 9 due to the presence inside the region 34 of an n type region 38 containing inside of it a region 39 which is n++ towards the surface and n+ in a deep region. The regions 34, 53, and 39 represent the base, collector and emitter, respectively, of the transistor T3.

There has been described a device which provides an integrated switching circuit in the same silicon chip with a control device and a power device. The presence of this switching circuit causes any lower-than-ground voltages on the collector of the power device during switching operations of the control device to prevent conduction of the parasitic transistors TP7, TP8, and TP9. These parasitic transistors of the control device (FIG. 7) are always present. The presence of the integrated switching circuit thus avoids damage to, or malfunctions of, the control device and of the power device itself.

While the invention has been particularly shown and described with reference to a preferred embodiment, it will be understood by those skilled in the art that various changes in form and detail may be made therein without departing from the spirit and scope of the invention.

What is claimed is:

1. Switching circuit for connecting a first circuit node to a second or to a third circuit node in response to a voltage on the third node, comprising a first bipolar transistor of the NPN type with the base connected to a positive power supply voltage, the collector connected to said first node and the emitter connected to said second node, a second bipolar transistor of the NPN type with the collector connected to said first node and the emitter connected to said third node, and means suitable for maintaining the base of said second transistor at a constant pre-set bias voltage, wherein said means for maintaining the base of the second transistor at a constant pre-set bias voltage includes a further bipolar transistor of the NPN type, with its emitter connected to the base of said second bipolar transistor, and with its collector connected to the positive power supply voltage, and wherein the emitter is connected to ground through a resistor means, wherein said further transistor is suitable for driving said second transistor so as to increase its gain.

2. Switching circuit according to claim 1, wherein said means for maintaining the base of the second transistor at a constant pre-set bias voltage further includes a pair of bipolar transistors of the NPN type arranged in cascade between the base of said further transistor and ground, the first of which is diode connected.

3. Switching circuit according to claim 1, wherein said resistor means consists of a diode.

4. Switching circuit according to claim 1, wherein said resistor means comprises a series of a diode and of a resistor having a small value.

5. Switching circuit for connecting a first circuit node to a second or to a third circuit node in response to a voltage on the third node, comprising a first bipolar transistor of the NPN type with the base connected to a positive power supply voltage, the collector connected to said first node and the emitter connected to said second node, a second bipolar transistor of the NPN type with the collector connected to said first node and the emitter connected to said third node, and means suitable for maintaining the base of said second transistor at a constant pre-set bias voltage, wherein the base of said first transistor is connected to the collector of a third bipolar transistor of the NPN type with its emitter connected to said third circuit node, with its collector connected to the positive power supply voltage through a bias resistor means, and with its base connected to the base of said second transistor, said third transistor being suitable for entering into saturation when the voltage of the third node is less than or equal to zero, lowering the base potential of said first transistor to values less than or equal to zero and thus switching it off.

6. A circuit for connecting a first circuit node to either a second or a third circuit node, comprising:
a first transistor switch connecting the first circuit node to the second circuit node;

a second transistor switch connecting the first circuit node to the third circuit node;

a third transistor having a collector connected to the base of said first transistor and to one end of a bias resistor having a second end connected to a positive power supply voltage, having an emitter connected to said third node, and having a base connected to a base of said second transistor switch; and control means for switching said first transistor switch on and said second transistor switch off when a voltage at the third circuit node is in a first range, and for switching said second transistor switch on when the voltage at the third circuit node is in a second range, wherein said third transistor causes said first transistor to turn off when the voltage is in the second range.

7. The circuit of claim 6, wherein the first range is greater than or equal to zero, and the second range is less than zero.

8. The circuit of claim 6, wherein said first and second transistor switches comprise bipolar transistors.

9. The circuit of claim 8, wherein said bipolar transistors comprise NPN transistors.

10. The circuit of claim 6, wherein the circuit is fabricated in a semiconductor device containing a control circuit and a power device, and wherein the first circuit node comprises an isolation region for the control circuit, the second circuit node is connected to device ground, and the third circuit node comprises a collector for the power device, wherein the collector is formed by a substrate of the integrated circuit.

11. The circuit of claim 6 wherein said control means comprises means for maintaining a base electrode of said second transistor at a constant preset bias voltage.

12. The circuit of claim 11, wherein said means for maintaining comprises a diode.

13. The circuit of claim 11, means for maintaining comprises a fourth transistor connected for driving the base electrode of said second transistor.

* * * * *